United States Patent
Dellaguardia et al.

(10) Patent No.: US 7,214,603 B2
(45) Date of Patent: May 8, 2007

(54) METHOD FOR FABRICATING INTERCONNECT STRUCTURES WITH REDUCED PLASMA DAMAGE

(75) Inventors: Ronald Dellaguardia, Poughkeepsie, NY (US); Elbert Huang, Tarrytown, NY (US); Qinghuang Lin, Yorktown Heights, NY (US); Robert Miller, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,931

(22) Filed: Jun. 1, 2005

(65) Prior Publication Data
US 2006/0183314 A1   Aug. 17, 2006

Related U.S. Application Data

(60) Provisional application No. 60/652,215, filed on Feb. 11, 2005.

(51) Int. Cl.
*H01L 21/44*     (2006.01)
*H01L 21/3205*   (2006.01)
*H01L 21/4763*   (2006.01)

(52) U.S. Cl. ........... 438/597; 438/586; 438/637; 438/638; 438/631; 438/672; 257/E21.575; 257/E21.579; 257/E21.587

(58) Field of Classification Search ........... 438/597, 438/586, 637–638, 631, 672
See application file for complete search history.

(56) References Cited

U.S. PATENT DOCUMENTS

2004/0127001 A1 *   7/2004  Colburn et al. ........... 438/586
2004/0175934 A1 *   9/2004  America et al. .......... 438/638

* cited by examiner

*Primary Examiner*—Michael Lebentritt
*Assistant Examiner*—Mohsen Ahmadi
(74) *Attorney, Agent, or Firm*—Connolly, Bove, Lodge & Hutz, LLP; Daniel Morris

(57) ABSTRACT

Methods to form interconnect structures utilizing sacrificial filling material layers are described herein. Utilizing the sacrificial filling material makes it possible to reduce damage to interlayer dielectric layers that result in enhanced device performance and/or increased reliability.

28 Claims, 7 Drawing Sheets

Cross-sectional View of a Portion of an Interconnect Structure During Fabrication

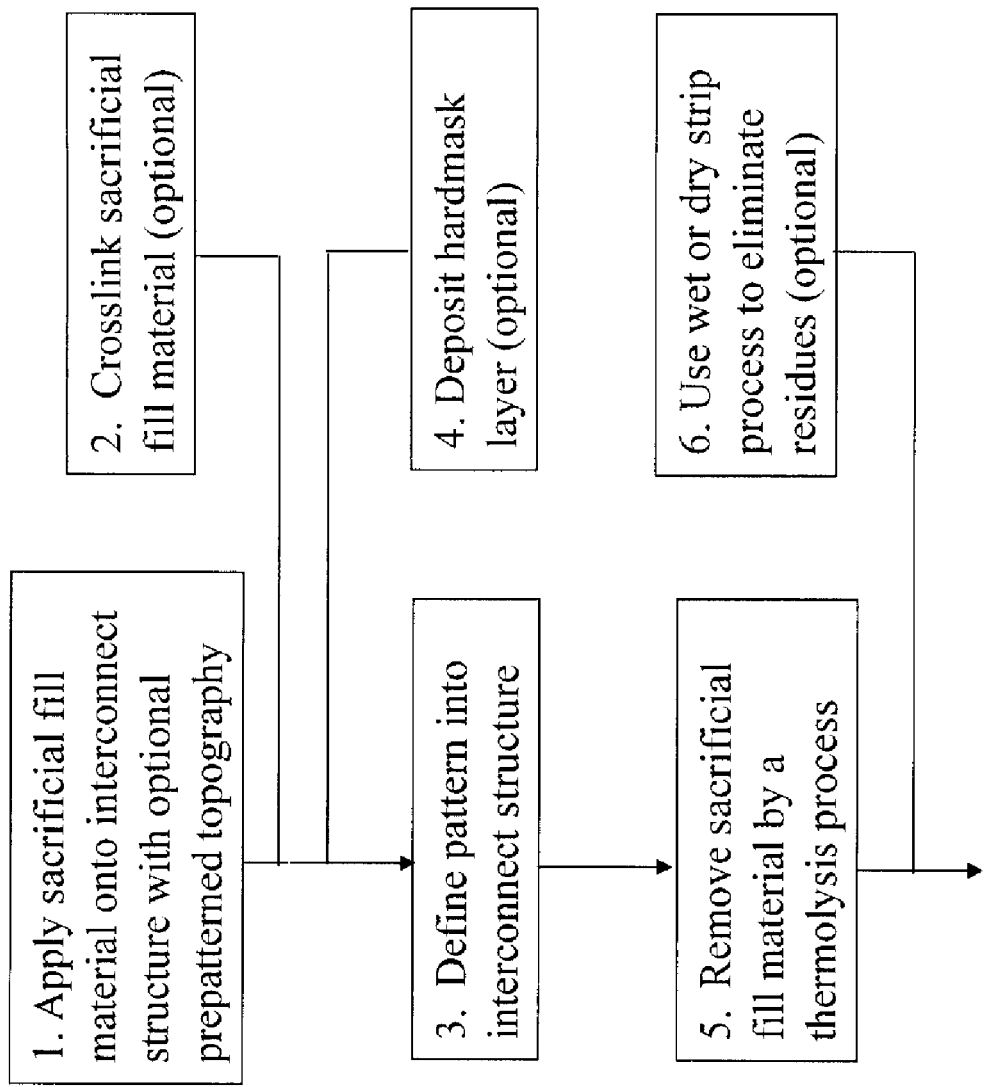
FIG. 1: General Process Flow for Method for Fabricating Interconnect Structures

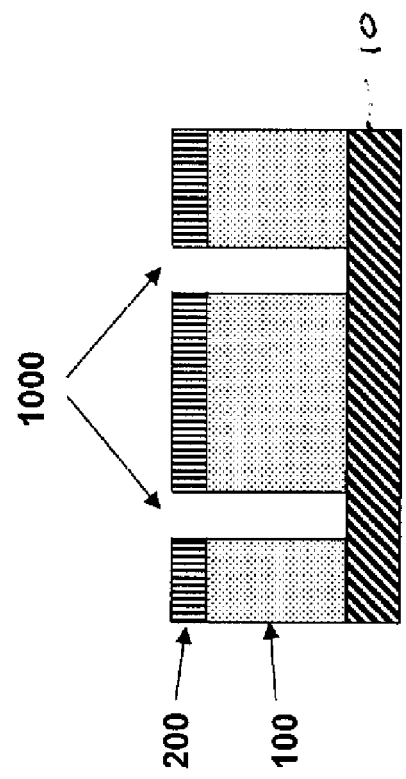
FIG. 2: Cross-sectional View of a Portion of an Interconnect Structure During Fabrication

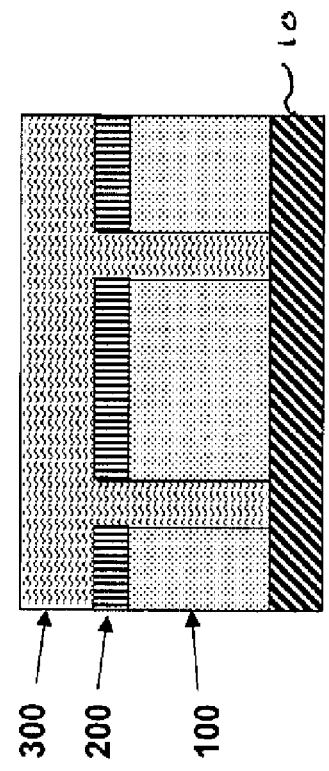
FIG. 3: Cross-sectional View of a Portion of an Interconnect Structure During Fabrication

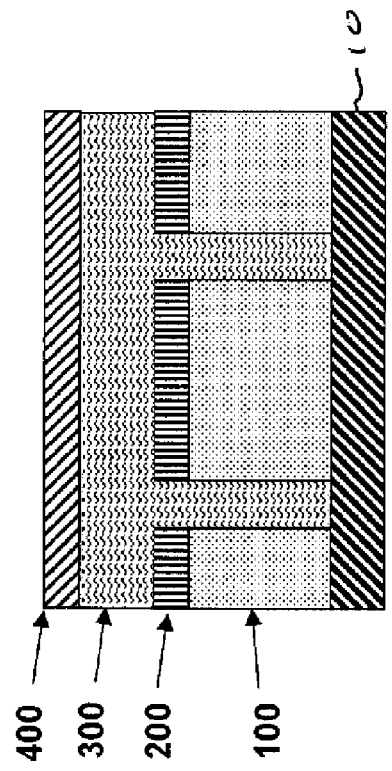
FIG. 4: Cross-sectional View of a Portion of an Interconnect Structure During Fabrication

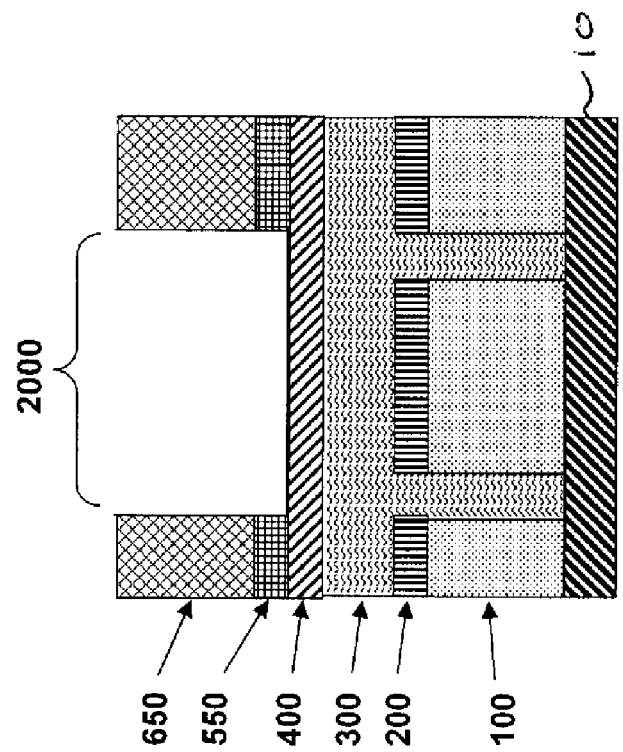
FIG. 5: Cross-sectional View of a Portion of an Interconnect Structure During Fabrication

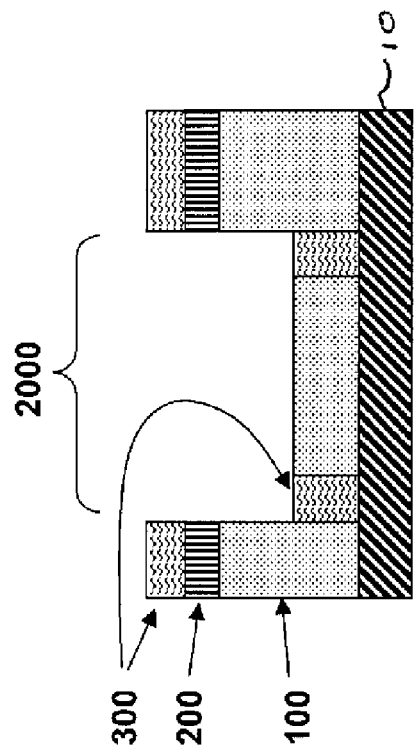
FIG. 6: Cross-sectional View of a Portion of an Interconnect Structure During Fabrication

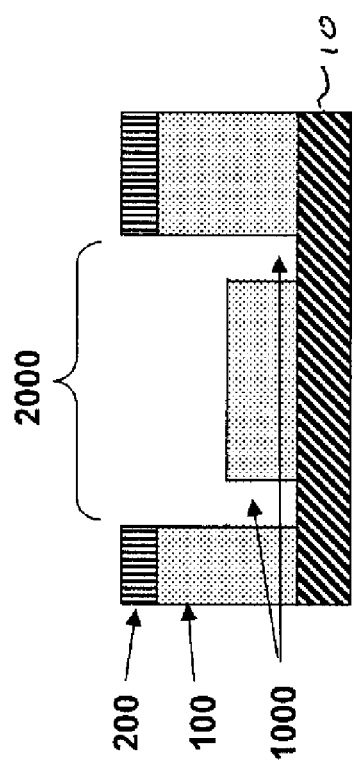
FIG. 7: Cross-sectional View of a Portion of an Interconnect Structure During Fabrication

METHOD FOR FABRICATING INTERCONNECT STRUCTURES WITH REDUCED PLASMA DAMAGE

CROSS REFERENCE TO RELATED APPLICATIONS

The present application claims priority from provisional application Ser. No. 60/652,215, filed Feb. 11, 2005 entitled "Method for Fabricating Interconnect Structures with Reduced Plasma Damage", disclosure of which is incorporated herein by reference.

BACKGROUND OF THE INVENTION

The present disclosure relates to the utilization of a sacrificial thermally labile material in the fabrication of interconnect structures that are part of integrated circuits and microelectronic devices. The primary advantages provided are reduced damage to interlayer dielectric layers that result in higher reliability and added performance through reductions in moisture uptake and resistance-capacitance delays, respectively.

It is widely known that the speed of propagation of interconnect signals is one of the most important factors controlling overall circuit speed as feature sizes are reduced and the number of devices per unit area is increased. Throughout the semiconductor industry, there has been a strong drive to reduce the dielectric constant, k, of the interlayer dielectric materials existing between metal lines. As a result, interconnect signals travel faster through conductors due to a reduction in resistance-capacitance (RC) delays. Unfortunately, these strategies are difficult to implement due to numerous issues associated with processing and integrating low dielectric constant materials as these materials can be especially prone to damage by various processes employed in the generation of interconnect structures. The damage observed in the dielectric materials is manifested by an increase in the dielectric constant and increased moisture uptake which may result in reduced performance and device reliability.

To reduce the dielectric constant of interlayer dielectric materials, a common approach is to introduce porosity into the material. This approach effectively supplants a portion of the dielectric material with air which has a dielectric constant of unity. Unfortunately, the introduction of porosity results in materials that are substantially more prone to modification by various processes commonly employed in the fabrication of interconnect structures as the porosity in these materials can often provide a pathway by which various chemical components can easily access the bulk of the low-k material. Thus, unlike dense dielectric systems, whereby modification may be localized to the surface of the dielectric and consequently may result in only minor effects, the extent of modification for a porous material can be dramatic as these changes can be realized through a significant portion of the dielectric material.

One particular processing step that is known to damage porous interlayer dielectric materials, including systems comprised of Si, C, O, and H, are plasma strip processes (i.e., dry strip) that are often used to remove sacrificial materials that are required in the integration process. These processes can result in removal of carbon in the interlayer dielectric film and may occur by a mechanism which involves demethylation and often results in increased dielectric constants and hydrophillicity of the materials. To minimize the damage associated with such processes, efforts have been on going in developing improved processes that result in less damage to the interlayer dielectrics or developing new materials that are less prone to damage. Although some progress has been made, the damage associated with plasma strip and related processes remain as a key issue in the implementation of low-k dielectric materials for interconnect structures.

Alternatively, wet strip processes are also being explored to supplant damaging dry strip processes. However, these processes may also result in damage to the interlayer dielectric. Furthermore, these processes often result in the creation of waste products as the wet clean used for these processes cannot be used indefinitely.

Finally, there have been approaches to address the issue of damage by subsequent repair processes that utilize a chemical component that reacts with the modified low-k interlayer dielectric. These approaches may involve silylating agents that convert pendent silanol groups to a different functional group resulting in a recovery of the hydrophobicity (i.e., reduced moisture uptake) of the dielectric and reduction of the dielectric constant from its damaged state. Although, these approaches may be promising, the additional processing step required for damage recovery may result in additional processing costs, material wastes, and lower yields.

Thus, in order to achieve high performance microelectronic devices, it is necessary to reduce the dielectric constant of the interlayer dielectric materials to reduce resistance-capacitance (RC) delays. The use of low-k materials as interlayer dielectrics provides the reduction in capacitance between conducting metal features. However, these materials must be processed in a manner such that their attributes are not significantly modified resulting in higher dielectric constants or moisture uptake which will invariably lead to reduced performance and/or reliability. Unfortunately, these low-k materials are prone to damage by various processes utilized in common integration schemes including dry strip processes. Consequently, alternative approaches to minimize or eliminate the processes that are sources for damage are important.

SUMMARY

This disclosure relates to methods that are utilized in interconnect structures that can be employed in any microelectronic device including: high speed microprocessors, application specific integrated circuits (ASICs), and memory storage devices. The interconnect structure may be comprised of at least one conductive feature, formed on the substrate, with the substrate further comprising at least one insulating layer surrounding the conductive feature. The insulating layer may surround the at least one conductive feature at its bottom and lateral surfaces. The structure may further comprise at least one conductive barrier layer disposed at, at least one interface between the insulating layer and the at least one conductive feature. The combination of the at least one conductive feature and the insulating layers, may be repeated to form a multilevel interconnect stack. The interconnect structure may be one of a silicon wafer containing microelectronic devices, a ceramic chip carrier, an organic chip carrier, a glass substrate, a gallium arsenide, silicon carbide or other semiconductor wafer, a circuit board, or a plastic substrate.

In particular, the disclosure relates to a method where the utilization of sacrificial fill material that is removed primarily by thermolysis is employed. This allows the generation of interconnect structures comprised of low-k dielectrics in a reliable manner and leads to enhanced device performance by minimizing damage to layers that occur in typical integration schemes. The sacrificial fill material may provide multiple purposes. First, it may serve as a planarizing layer in structures having topography in order to facilitate lithographic processing. Second, it may provide etch contrast during standard dry etch processes that are used to define the structure of the interconnect structure. Third, it is designed to be facilely removed by a thermolysis process in order to minimize damage to the interconnect structure. The facile removal of the sacrificial fill material by thermolysis provides an alternative approach to commonly used strip processes (e.g., oxidizing or reducing plasmas) that are known to result in significant damage to low-k interlayer dielectrics. This damage leads to higher dielectric constants and increased moisture uptake which may result in reduced performance and device reliability.

Other and further objects, advantages and features of the present disclosure will be understood by reference to the following specification in conjunction with the annexed drawings, wherein like parts have been given like numbers.

BRIEF DESCRIPTION OF THE DRAWINGS

FIG. 1 is a schematic showing a generalized process flow for the use of a sacrificial fill material for the generation of an interconnect structure.

FIG. 2 is a cross-sectional view of a portion of the interconnect structure illustrated in accordance with an exemplary embodiment of the present invention.

FIG. 3, is a cross-sectional view of a portion of the interconnect structure showing the deposition of the sacrificial fill material.

FIG. 4, is a cross-sectional view of a portion of the interconnect structure showing the deposition of the hardmask layer.

FIG. 5, is a cross-sectional view of a portion of the interconnect structure showing the deposition of antireflective and photoresist layer followed by patterning.

FIG. 6, is a cross-sectional view of a portion of the interconnect structure showing the transfer of the pattern defined by the photoresist layer into underlying layers in the interconnect structure.

FIG. 7, is a cross-sectional view of a portion of the interconnect structure showing the interconnect structure after removing the sacrificial fill material by thermolysis

DESCRIPTION OF PREFERRED AND VARIOUS EMBODIMENTS

A detailed description of the methods involving sacrificial fill material is presented below. The sacrificial fill material can be utilized to enable the fabrication of interconnects that can be used in any microelectronic device.

Referring to FIG. 1, a general process flow for the fabrication of interconnect structures is described. First, the sacrificial fill material is applied to an interconnect structure which may contain a prepatterned topography. Optionally, the sacrificial fill material can then be crosslinked. A hardmask material may also be optionally applied atop the sacrificial fill material. A pattern is then defined into the interconnect structure. Next the sacrificial fill material is removed by a thermolysis process. Optionally, a wet or dry strip process can be employed to remove any residue remaining from the sacrificial fill material after thermolysis.

The sacrificial fill material may be comprised of a polymeric system comprised of one or more components and may have any architecture including linear, branched, hyperbranched, star, etc. The sacrificial fill material may be a homopolymer, copolymer, or polymer mixture. Examples of materials that may be utilized as the sacrificial fill include but are not limited to: styrene polymers; polyesters; methacrylate polymers; acrylate polymers, polyesters, polyamides, polynorbornenes, polycarbonates, olefin polymers such as ethylene polymers and propylene polymers; acrylic acid polymers, poly(ethers), poly(amides), epoxy resins, poly(urethanes), poly(alkanes), poly(dienes), poly(vinyl alcohol), poly(vinyl ethers), and poly(ureas). Preferably, the sacrificial fill material is thermally stable to temperatures in excess of about 150° C. and may have a high glass transition temperature in excess of about 150° C.

For single damascene integration, the interconnect structure will not contain the prepatterned topography and the uppermost layers should be planar. The pattern that is defined into this interconnect structure may correspond to either conducting metal vias, which form conductive pathways in a direction normal to the substrate, or lines, which form conductive pathways in a direction parallel to the substrate, whereby the metals are deposited by subsequent known processes.

For dual damascene integration the prepatterned topography may correspond to the vias and the pattern formed with the sacrificial fill material present may correspond to line patterning. Alternatively, the reverse may occur whereby the prepatterned topography may correspond to the lines and the pattern formed with the sacrificial fill material present may correspond to via patterning. Referring to FIG. 2, an interconnect structure comprised of an interlayer dielectric 100 on substrate 10, chemical mechanical polish stop layer 200, is shown with the prepatterned topography 1000 having a via pattern is shown.

Typically the interconnect structure comprises a porous low-k dielectric between about 1.3 and 3.0 which may be porous ultralow-k dielectric comprised of a silsesquioxane or siloxane system or a porous ultralow-k dielectric such as a CVD deposited dielectric having the composition $Si_vN_w C O_yH_z$ where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$. Examples of the insulating or dielectric material 100 include the following low-k dielectrics: porous or nonporous CVD deposited SiCOH or carbon doped oxides (available from AMAT under the trade designation Black Diamond, from ASM under the trade designation Auora, and from Novellus under the trade designation of Coral) and porous and non-porous organo silicates, spin-on silsesesquioxanes and siloxanes (available from Japanese Synthetic Rubber under the trade designation of LKD-5109 and LKD-5530).

Typical chemical mechanical polish stop layers 200, may be nonporous carbon doped oxides, CVD deposited SiCOH or SiCH systems, or spin-on organo silicates, silsesesquioxanes, and siloxanes.

The sacrificial fill material can be applied by a variety of technologies including any solvent based process such as spin coating, spray coating, scan coating, and dip coating. More typically, the sacrificial fill material is contained in a solution having an organic solvent which may be one or a combination of the following: propylene glycol methyl ether acetate (PGMEA), propylene glycol methyl ether (PGME), toluene, xylenes, anisole, mesitylene, butyrolactone, cyclohexanone, hexanones, ethyl lactate, and heptanones. Optionally, an antistriation agent may be codissolved in the solution containing the sacrificial fill material to produce films of high uniformity. When present the antistriation agent is employed in amounts of about 0.2 to about 2 weight percent based upon the amount of sacrificial fill material.

In cases where a prepatterned topography exists, the sacrificial fill material preferably will planarize and gap fill the topographical features. The overburden thickness of the sacrificial fill material, which is the thickness of the sacrificial fill material atop the uppermost regions of the prepatterned topography, is typically in the range of 50–500 nm.

Referring to FIG. 3, an interconnect structure with the sacrificial fill material 300 having a planar surface atop the interlayer dielectric 100 and chemical mechanical polish stop layer 200 while filling the prepatterned topography 1000 is shown.

After deposition, the sacrificial fill material may be crosslinked by a thermal anneal, irradiation by ultraviolet or visible light, exposure to an electron beam irradiation, or any combination thereof, whereby, the crosslinking process involves curing temperatures in the range of about 90–400° C. The crosslinking process can be performed in an inert atmosphere. The application of the crosslinking process may allow the deposition of additional layers atop the sacrificial fill material 300 without issues associated with: film integrity (e.g., film cracking or buckling), undesired interdiffusion between the sacrificial fill material and layers deposited atop the sacrificial film material, and dissolution of the sacrificial fill material for coatings of subsequent layers by solvent based processes.

The crosslinking may occur through chemical reactions involving functional groups that are in the sacrificial fill material. The functional groups involved in the crosslinking may include: epoxy, methacrylate, vinyl, styrenic, alcohol, phenol, carboxylic acid, isocyanate, and amines. In addition, the crosslinking can be facilitated by adding reactive additives to the solution containing the sacrificial fill material which may include free radical initators, ultraviolet initiators, thermal acid generators. The crosslinking can proceed by any chemical process including free-radical, acid-base reactions, etc.

Referring to FIG. 4, a hardmask layer 400 that serves as an etch contrast layer may be deposited atop the sacrificial fill material 300 atop the interlayer dielectric 100 and chemical mechanical polish stop layer 200. The hardmask layer 400 may be deposited by any process including solution based processes including spin coating, spray coating, dip coating, and scan coating or by vapor deposition processes including chemical vapor deposition, physical deposition, sputtering, evaporation, and plasma enhanced chemical vapor deposition. The hardmask layer 400 may be comprised of a silicon oxide, silicon carbide, or silicon nitride.

Referring to FIG. 5, the definition of the pattern 2000 can then be defined using standard lithographic processes that may include an antireflective coating layer 550 and photopatternable layer 650 that are deposited atop the interconnect structure. The sacrificial fill material 300 facilitates this lithography process by providing a planar surface for the coating layer 550 and photopatternable layer 650.

Examples of some typical antireflective coatings are antireflective coatings available from Rohm & Haas under the tradenames of AR3, AR19, AR40 and antireflective coatings available from Japanese Synthetic Rubber under the tradename of NFC.

Examples of some typical photopatternable layers are photopatternable layers available from Japanese Synthetic Rubber under the trademane of AR237 and AR414.

The pattern 2000 can then be transferred into the interlayer dielectric 100 and chemical mechanical polish stop layer 200 of the interconnect structure by standard dry etch transfer processes as shown in FIG. 6. During this pattern transfer process, the hardmask layer 400 and a portion of the sacrificial fill material 300 may be removed. The sacrificial fill material 300 may facilitate the pattern transfer process by providing etch contrast during dry etch processes.

Referring to FIG. 7, the sacrificial fill material 300 is then removed by a thermolysis process resulting in a interconnect structure having a prepatterned topography 1000 and pattern 2000. The thermolysis process may involve an annealing step at temperatures in excess of about 200° C. whereby the sacrificial fill material degrades into low molecular weight byproducts that are expelled from the structure. More typically the temperature of the annealing is in excess of about 250° C. and even more typically is no greater than about 400° C.

The thermolysis process may be performed under inert or reducing atmospheres including but not limited to atmospheres comprising vacuum, nitrogen, argon, helium, and forming gas or any combination thereof. Furthermore, the thermolysis process may result in further curing of interlayer dielectric or in porosity formation in of the low-k interlayer dielectric 100 by a removal of an optional sacrificial pore generator contained in the low-k interlayer dielectric.

If the thermolysis process does not completely remove the sacrificial fill material 100, a reactive plasma strip or wet clean process may be employed to remove any remaining residue from said sacrificial fill material. The reactive plasma strip may be generated from one or a combination of the following $N_2$, $H_2$, $NH_3$, $O_2$, $CH_3F$, $C_2F_6$, He, and $CO_2$. In addition, a wet clean process may be employed to remove any remaining residue from sacrificial fill material and may include the use of: organic solvents, aqueous acids, and aqueous bases.

The pattern 2000 can be filled with a conductive material (not shown) such as Cu, Al, Ag, Au, and alloys thereof, and more typically Cu and Cu alloys. Also, if desired, prior to depositing the conductive material, a barrier layer can be deposited on the bottom and side walls of the pattern 2000.

Typical barrier layers are tungsten, titanium, tantalum, nitrides thereof and alloys thereof. Also, the barrier layer can include two or more layers (e.g.—W/WN bilayer). The barrier layer can be deposited by chemical vapor deposition (CVD or by sputtering such a physical vapor deposition (PVD) or ionized physical vapor deposition (IPVD).

Other processes known in the art may be used to generate the interconnect structure following dual damascene integration. These include processes such as photolithography, deposition of patterning layers, metal containing lining barrier deposition, metal plating, chemical mechanical polishing, and other common processes known in the art. These steps can be performed repetitively in order to generate a multilevel interconnect structure.

What is claimed as new and desired to be protected by Letters Patent of the United States is:

1. A method for fabricating an interconnect structure which comprises a low-k interlayer dielectric by a damascene process which comprise:

applying a sacrificial fill material onto an interconnect structure that optionally comprises a prepatterned topography defining a pattern into the interconnect structure by lithographic and dry etch transfer processes removing the said sacrificial fill material by a thermolysis process, and wherein the said sacrificial fill material degrades into low molecular weight byproducts that are expelled from the fill during said thermolysis process.

2. The method of claim 1, wherein the said prepatterned topography corresponds to the vias of an interconnect structure and the said pattern corresponds to the lines of an interconnect structure.

3. The method of claim 2, wherein the reactive plasma strip is generated from one or a combination of the following $N_2$, $H_2$, $NH_3$, $O_2$, $CH_3F$, $C_2F_6$, He, and $CO_2$.

4. The method of claim 1, wherein the said prepatterned topography corresponds to the lines of an interconnect structure and the said pattern corresponds to the vias of an interconnect structure.

5. The method of claim 1, wherein the said sacrificial fill material comprises an organic polymer.

6. The method of claim 5 wherein the organic polymer is at least one polymer selected from the group consisting of homo- and co-polymers of styrene; polyesters; methacrylate homo-and co-polymers; acrylate homo- and co-polymers; homo-and co-polymers of norbornene; poly(ethers), poly(amides), poly(carbonates), epoxy resins, poly(urethanes), poly(alkanes), poly(dienes) poly(vinyl alcohol), poly(vinyl ethers), poly(ureas), olefin homo- and co-polymers; and acrylic acid homo- and co-polymers.

7. The method of claim 5 wherein said fill material further comprises a crosslinking agent.

8. The method of claim 7, which further comprises crosslinking the said sacrificial fill material by a thermal anneal, irradiation by ultraviolet or visible light, exposure to an electron beam irradiation, microwave, or a combination thereof.

9. The method of claim 8, wherein the said crosslinking involves curing temperatures in the range of about 90–400° C.

10. The method of claim 1, wherein the said sacrificial fill material is thermally stable to temperatures in excess of about 150° C.

11. The method of claim 1, wherein the said sacrificial fill material has a high glass transition temperature in excess of about 150° C.

12. The method of claim 11, wherein the said low-k interlayer dielectric, comprises at least one member selected from the group consisting of spin-on silsesquioxane, siloxane and a CVD deposited dielectric having the composition $Si_vN_wC_xO_yH_z$. where $0.05 \leq v \leq 0.8$, $0 \leq w \leq 0.9$, $0.05 \leq x \leq 0.8$, $0 \leq y \leq 0.8$, $0.05 \leq z \leq 0.8$ for $v+w+x+y+z=1$.

13. The method of claim 1, wherein the sacrificial fill material is applied by a solvent based process.

14. The method of claim 13, wherein said solvent based process is selected based from the group consisting of spin coating, spray coating, scan coating, an dip coating.

15. The method of claim 13, wherein said solvent based process comprises employing a solution containing at least one solvent selected from the group organic solvent which may be comprised of one or consisting: propylene glycol methyl ether acetate (PGMEA), propylene glycol methyl ether (PGME), toluene, xylenes, anisole, mesitylene, butyrolactone, cyclohexanone, hexanones, ethyl lactate, and heptanones.

16. The method of claim 13, wherein an antistriation agent is codissolved in the solution containing the sacrificial fill material to produce films of high uniformity.

17. The method of claim 1, wherein the said sacrificial fill material planarizes and gap fills the said interconnect structure having topographical features.

18. The method of claim 1, wherein the said sacrificial fill material forms an overburden thickness of 50–500 nm.

19. The method of claim 1, wherein the said sacrificial fill material is partially removed by the said definition of the said pattern into the interconnect structure by lithographic and dry etch transfer processes.

20. The method of claim 1, wherein the said thermolysis process comprises an annealing step at temperatures in excess of 200° C.

21. The method of claim 1, wherein the said thermolysis process is performed under inert or reducing atmospheres selected from the group consisting of vacuum, nitrogen, argon, helium, and forming gas.

22. The method of claim 1, wherein the said thermolysis process results in further curing of the said low-k interlayer dielectric or results in porosity formation in the said low-k interlayer dielectric by a removal of a sacrificial pore generator contained in the said low-k interlayer dielectric.

23. The method of claim 1, which further comprises employing a reactive plasma strip after the thermolysis step to remove any remaining residue from the sacrificial fill material.

24. The method of claim 1, which further comprises a wet clean process after the thermolysis step to remove any remaining residue from the sacrificial fill material and wherein the wet clean comprises at least one of organic solvents, aqueous acids, and aqueous bases.

25. The method of claim 1, wherein a hardmask layer that serves as an etch contrast layer is deposited atop said sacrificial fill material and is consumed during the said definition of the said pattern into the interconnect structure by lithographic and dry etch transfer processes.

26. The method of claim 25, wherein the said hardmask layer is deposited atop said sacrificial fill material by a solution based process selected from the group consisting of spin coating, spray coating, dip coating, and scan coating or by a vapor deposition process selected from the group consisting of chemical vapor deposition, physical deposition, evaporation, sputtering, and plasma enhanced chemical vapor deposition.

27. The method of claim 25, wherein the said hardmask layer comprises at least one member selected from the group consisting of silicon oxide, silicon carbide, and silicon nitride.

28. The method of claim 1, wherein the dielectric constant of the low-k dielectric is about 1.3 to about 3.0.

* * * * *